(12) United States Patent
Liu et al.

(10) Patent No.: US 10,263,049 B2
(45) Date of Patent: Apr. 16, 2019

(54) COLOR FILTER SUBSTRATE AND METHOD OF MANUFACTURING THE SAME, ORGANIC LIGHT EMITTING DISPLAY PANEL AND DISPLAY DEVICE

(71) Applicant: BOE Technology Group Co., Ltd., Beijing (CN)

(72) Inventors: Wei Liu, Beijing (CN); Dongfang Wang, Beijing (CN); Song-Young Suk, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 151 days.

(21) Appl. No.: 14/771,566

(22) PCT Filed: Sep. 22, 2014

(86) PCT No.: PCT/CN2014/087080
§ 371 (c)(1),
(2) Date: Aug. 31, 2015

(87) PCT Pub. No.: WO2015/192517
PCT Pub. Date: Dec. 23, 2015

(65) Prior Publication Data
US 2016/0365386 A1    Dec. 15, 2016

(30) Foreign Application Priority Data

Jun. 16, 2014 (CN) .......................... 2014 1 0267499

(51) Int. Cl.
*H01L 27/32*    (2006.01)
*G03F 7/00*    (2006.01)
(Continued)

(52) U.S. Cl.
CPC ............ *H01L 27/322* (2013.01); *G02B 5/201* (2013.01); *G03F 7/0007* (2013.01);
(Continued)

(58) Field of Classification Search
CPC . G03F 7/0007; H01L 27/322; H01L 51/5228; H01L 51/525; H01L 51/5384; G02B 5/201
(Continued)

(56) References Cited

U.S. PATENT DOCUMENTS 5,850,271 A * 12/1998 Kim .................. G02F 1/133512
349/106
8,310,628 B2    11/2012 Sakata et al.
(Continued)

FOREIGN PATENT DOCUMENTS

CN    101364014 A    2/2009
CN    101675377 A    3/2010
(Continued)

OTHER PUBLICATIONS

Plasma ashing—Wikipedia https://en.wikipedia.org/wiki/Plasma_ashing, 2004.*
(Continued)

*Primary Examiner* — Zachary W Wilkes
*Assistant Examiner* — George G King
(74) *Attorney, Agent, or Firm* — Westman, Champlin & Koehler, P.A.

(57) ABSTRACT

The present disclosure provides a color filter substrate, comprising a base substrate, and a color filter matrix, a black matrix and spacers formed in order on the base substrate, the color filter matrix being consisted of a plurality of red, green and blue photoresists. The red, green and blue photoresists are respectively and separately formed within corresponding pixel regions, and are overlapped with one another to form three-layer stacked structures within gap regions between adjacent pixel regions, and, the black matrix and the spacers are sequentially formed on the stacked structures within the pixel regions. The present disclosure further provides a method of manufacturing a color filter substrate, an organic light emitting display panel and a display device. With the solutions of the present disclosure, the red, green and blue photoresists are arranged to overlap with one another to form the stacked structures within the gap regions between adjacent pixel regions, so that the height of the color filter (Continued)

substrate can be increased, the manufacturing height of the spacers is decreased and the process implementation difficulty is reduced, thereby improving the production yield of the color filter. Moreover, the barrier layer can also greatly reduce residues of the material of the black matrix, further improving the production yield of the color filter substrate.

15 Claims, 6 Drawing Sheets

(51) Int. Cl.
    *G02B 5/20*     (2006.01)
    *H01L 51/52*     (2006.01)

(52) U.S. Cl.
    CPC ........ *H01L 51/525* (2013.01); *H01L 51/5228* (2013.01); *H01L 51/5284* (2013.01)

(58) Field of Classification Search
    USPC .................. 359/885, 887, 890, 891; 349/106
    See application file for complete search history.

(56) References Cited

U.S. PATENT DOCUMENTS

| | | | | |
|---|---|---|---|---|
| 8,552,631 | B2* | 10/2013 | Lee | ....................... H01L 51/444 |
| | | | | 313/352 |
| 2011/0155296 | A1* | 6/2011 | Nakamura | ............. G02B 5/201 |
| | | | | 156/67 |
| 2012/0169977 | A1 | 7/2012 | Tsubata | |
| 2014/0098332 | A1 | 4/2014 | Kim et al. | |
| 2015/0277017 | A1* | 10/2015 | Aoyagi | ............... H01L 51/5271 |
| | | | | 362/608 |

FOREIGN PATENT DOCUMENTS

| | | |
|---|---|---|
| CN | 103681693 A | 3/2014 |
| CN | 103700688 A | 4/2014 |
| CN | 103943659 A | 7/2014 |
| JP | 2005-3854 A | 1/2005 |
| JP | 2009-169064 A | 7/2009 |
| TW | 201038981 A1 | 11/2010 |
| TW | 201418827 A | 5/2014 |

OTHER PUBLICATIONS

Second Office Action from Chinese Patent Application No. 201410267499.2, dated Oct. 17, 2016.
International Search Report and Written Opinion for PCT Application No. PCT/CN2014/087080, dated Mar. 16, 2015, 12 pages.
English translation of Box No. V from the Written Opinion of the International Searching Authority for PCT Application No. PCT/CN2014/087080, 3 pages.
First Office Action, including Search Report, for Chinese Patent Application No. 201410267499.2, dated Jun. 1, 2016, 15 pages.
Rejection Decision for Chinese Patent Application No. 201410267499.2, dated May 10, 2017, 14 pages.

* cited by examiner

COLOR FILTER SUBSTRATE AND METHOD OF MANUFACTURING THE SAME, ORGANIC LIGHT EMITTING DISPLAY PANEL AND DISPLAY DEVICE

CROSS-REFERENCE TO RELATED APPLICATIONS

This application is a Section 371 National Stage Application of International Application No. PCT/CN2014/087080, filed 22 Sep. 2014, which claims the benefit of Chinese Patent Application No. 201410267499.2 filed on Jun. 16, 2014 in the State Intellectual Property Office of China, the whole disclosure of which is incorporated herein by reference.

BACKGROUND

Technical Field

Embodiments of the present disclosure generally relate to the field of display technologies, and particularly, to a color filter (CF) substrate and a method of manufacturing the same, an organic light emitting display panel, and a display device.

Description of the Related Art

Active matrix organic light emitting diode (AMOLED) panel is applied as a next generation display technology, and has advantages in image quality, efficiency and cost over conventional thin film transistor LCD (TFT-LCD). Specifically, in terms of display efficiency, AMOLED has a quicker response speed, a higher contrast and a wider visual angle. AMOLED has a small amount of electricity consumption, which is only about 60% of that of TFT-LCD. Further, AMOLED has a self luminous property without requiring backlight source, and thus it can be manufactured to be lighter and thinner than TFT-LCD and reduce a cost of a backlight module, which is up to 30~40% of a production cost of TFT-LCD.

However, the greatest problem presented in AMOLED is yield, and the price of AMOLED is much higher than that of TFT-LCD when manufactured with the current yield, which limits wide application of AMOLED to a large extent.

Currently, a WOLED+CF mode, which is a mode in which color filters (CFs) are used in combination with a white OLED back panel, is utilized to achieve color display by some display manufacturers. As a technological choice of AMOLED, the WOLED+CF mode not only has advantages such as high availability of organic electroluminescence (EL) materials, high aperture ratio, easiness in achieving large screen and the like, but also tends to ensure the yield in mass production.

The WOLED+CF mode is usually achieved in a way that an array back panel and a CF substrate are assembled. A structure of a conventional CF substrate used for LCD display is shown in FIG. 1. During the manufacturing of the CF substrate, generally, firstly a black light shielding region or black matrix (BM) is manufactured, then sub-pixel color filters of three colors of red/green/blue (R/G/B) are manufactured, and finally, post spacers (PS) are manufactured, as supports, at positions corresponding to the BM. Specific process steps of manufacturing the post spacers comprises: coating and patterning a BM material; coating and patterning red, green and blue photoresists; forming an over-coat (OC); and forming PS posts.

However, since a larger assembly thickness is required in the WOLED+CF implementation of AMOLED, it is required that the PS posts, as supports, in the CF substrate have a larger height, which is very difficult to be implemented in process, results in much complicated process implementation steps, and cannot ensure yield. Moreover, such PS structures will be easily damaged during the assembly with the OLED back panel, thereby resulting in reduction in overall yield of AMOLED.

SUMMARY

In order to solve at least one of the above and other problems in prior art, the present disclosure provides a color filter substrate and a method of manufacturing the same, an organic light emitting display panel, and a display device.

According to one aspect of the present disclosure, there is provided a color filter substrate, comprising a base substrate, and a color filter matrix, a black matrix and spacers formed in order on the base substrate, the color filter matrix being consisted of a plurality of red, green and blue photoresists, wherein:

the red, green and blue photoresists are respectively and separately formed within corresponding pixel regions, and are overlapped with one another to form three-layer stacked structures within gap regions between adjacent pixel regions; and the black matrix and the spacers are sequentially formed on the stacked structures within the respective gap regions.

The above color filter substrate may further comprise a barrier layer formed between the color filter matrix and the black matrix, for reducing residues of a material of the black matrix.

In the above color filter substrate, the barrier layer may be made of inorganic material, such as silicon dioxide.

In the above color filter substrate, the barrier layer may be subjected to ashing treatment.

The color filter substrate may further comprise an auxiliary electrode layer covering over the color filter matrix, the black matrix and the spacers.

In the above color filter substrate, the black matrix is consisted of a plurality of light shielding units, each of the spacers is formed on corresponding one of the light shielding units, and a direct projection area of each spacer on the base substrate may be smaller than that of its corresponding light shielding unit on base substrate.

According to another aspect of the present disclosure, there is provided an organic light emitting display panel comprising the above described color filter substrate.

According to a further aspect of the present disclosure, there is provided a display device comprising the above described organic light emitting display panel.

According to a still further aspect of the present disclosure, there is provided a method of manufacturing a color filter substrate, comprising steps of:

forming, on a base substrate, and patterning red, green and blue photoresist layers so as to form a color filter matrix configured that the red, green and blue photoresists are respectively and separately formed within corresponding pixel regions, and are overlapped with one another to form three-layer stacked structures within gap regions between adjacent pixel regions; and sequentially forming patterns of a black matrix and spacers on the stacked structures within the gap regions.

The above method may further comprise: a step of forming a barrier layer on the color filter matrix before forming the black matrix, the barrier layer being used to reduce residues of a material of the black matrix.

The barrier layer may be made of inorganic material, such as silicon dioxide.

The above method may further comprise a step of performing ashing treatment on the barrier layer, after forming the barrier layer. The ashing treatment may be performed in an oxygen or fluorine atmosphere for a treatment time of 10 s~30 s.

The above method may further comprises a step of forming, after forming the spacers, an auxiliary electrode layer on the color filter substrate to cover over the color filter matrix, the black matrix and the spacers.

According to the abovementioned technical solutions of the present disclosure, on one hand, the red, green and blue photoresists are overlapped with one another at the gap regions between corresponding adjacent pixels, and are respectively and separately arranged within corresponding pixel regions, thus, the height of the color filter with the stacked structure is larger than that of conventional color filter, which reduces a manufacturing height of the spacers, thereby reducing process implementation difficulty and improving production yield of color filter. On the other hand, in the present disclosure, arrangement of the barrier layer enables a great reduction in residues of a material of the black matrix and a further improvement of the production yield of the color filter substrate. In a further aspect, the black matrix is arranged on the color filter matrix and is located closer to light-emitting regions of pixels, which reduces, compared to prior art, light leakage phenomenon among pixel regions in a better way, and may further increase an understructure height of the color filter substrate, thereby further decreasing the manufacturing height of the spacers and reducing process implementation difficulty, and improving the production yield of the color filter. In a still further aspect, in the present disclosure, the stacked arrangement of overlapping the color filter matrix, the black matrix and the spacer enables the manufactured color filter substrate to be more stable and firmer than a single-spacer design in prior art during assembling, thereby still further improving reliability and production yield of the color filter substrate.

DETAILED DESCRIPTION OF PREFERRED EMBODIMENTS

In order to provide a more clear understanding of objects, technical solutions and advantages of the present disclosure, the present disclosure will be further described hereinafter in detail in conjunction with embodiments and with reference to the attached drawings.

Further, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
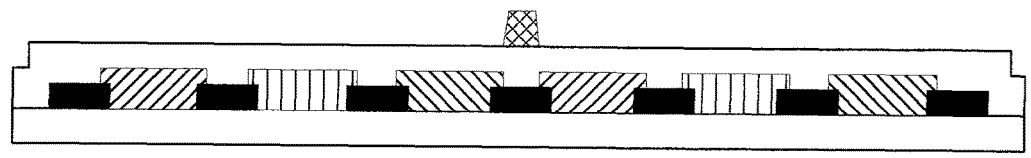
FIG. 1 is a schematically structural diagram of a CF substrate in prior art.
Figure 2:
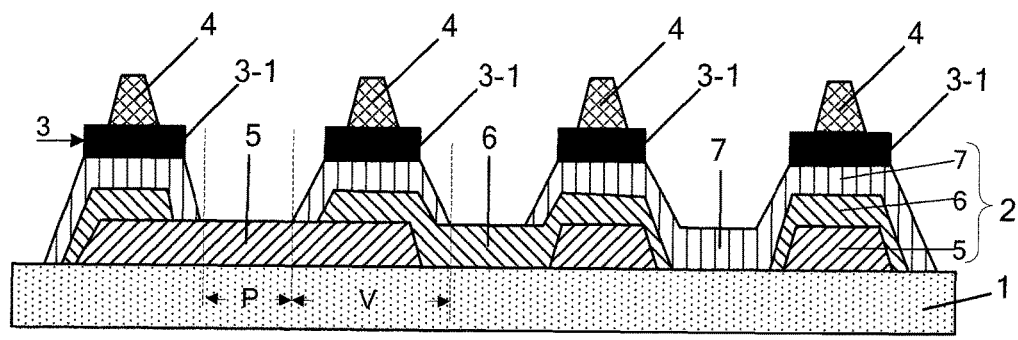
FIG. 2 is a schematically structural diagram of a CF substrate according to one embodiment of the present disclosure.

According to an exemplary embodiment of the present disclosure, there is provided a color filter substrate. As shown in FIG. 2, the color filter substrate comprises a base substrate 1, and, a color filter matrix 2, a black matrix (BM) 2 and spacers (PS) 4 formed in order on the base substrate 1.

Exemplarily, material for manufacturing the base substrate 1 may include glass, silicon, quartz, plastic or the like, and preferably, is glass.

The color filter matrix 2 is consisted of a plurality of groups of red photoresists 5, green photoresists 6 and blue photoresists 7 corresponding to a pixel array. The red, green and blue photoresists 5, 6, 7 are respectively and separately formed within corresponding pixel regions P, and are overlapped with one another to form three-layer stacked structures within gap regions V between adjacent pixel regions P. In other words, each pixel region P only contains therein one photoresist of corresponding color, while the red, green and blue photoresists are overlapped within respective gap regions V between adjacent pixel regions.

It will be understood by those skilled in the art that the color filter is a key component in a display device, such as a liquid crystal display, enabling display of colors, and light from a light source passes through at least red, green and blue photoresists of the color filter to provide corresponding hues, which finally form color display images, wherein the red, green and blue photoresists need to be separately formed within corresponding pixel regions. As shown in FIG. 2, three recessed regions shown in the figure are pixel regions P, within which the red photoresist 5, the green photoresist 6, and the blue photoresist 7 are respectively formed, so that light from the light source can form red, green and blue light within corresponding pixel regions when passing through the color filter.

With these embodiments of the present disclosure, the red, green and blue photoresists, while respectively and separately being formed within corresponding pixel regions, are formed to be overlapped with one another within gap regions between adjacent pixel regions, with reference to FIG. 2. Four raised regions shown in FIG. 2 correspond to gap regions V between adjacent pixel regions P, and red, green and blue photoresists are formed to be overlapped with one another within the four gap regions, accordingly, the color filter having such formed stacked structure is increased in height relative to the color filter in prior art, which can reduce the manufacturing height of the spacers 4, thereby reducing process implementation difficulty and improving production yield of the color filter. The black matrix 3 and the spacers 4 are sequentially formed on the stacked structures of red, green and blue photoresists in the color filter matrix 2, that is, the black matrix 3 and the spacer 4 are formed on each stacked structure formed of the red, green and blue photoresists 5, 6, 7 in the color filter matrix 2. Exemplarily, the black matrix 3 may be consisted of a plurality of light shielding units 3-1 corresponding to the pixel array, and each of the spacers 4 is formed on corresponding one of the light shielding units 3-1.

The black matrix 3 may be made of material of high opacity, and optionally, the material for the black matrix 3 may be resin material doped with light shielding material.

The spacer 4 is used as a support, and is made of a material having high elastic recovery rate and high deformation bearing capacity under an external pressure, thereby, the manufactured substrate can be more stable and firmer during assembling, and the finally finished AMOLED has higher pressure and deformation resistances.

The above arrangement of the black matrix 3 can reduce light leakage among pixel regions, further increase the understructure height of the color filter substrate, further reduce the manufacturing height of the spacer 4, reduce process implementation difficulty, and improve the production yield of the color filters. In addition, in the present disclosure, the arrangement of overlapping the color filter matrix, the black matrix and the spacers enables the manufactured color filter substrate to be more stable and firmer, than a single-spacer design in prior art, during assembling, thereby further improving the reliability and production yield of the color filter substrate.

Figure 3:
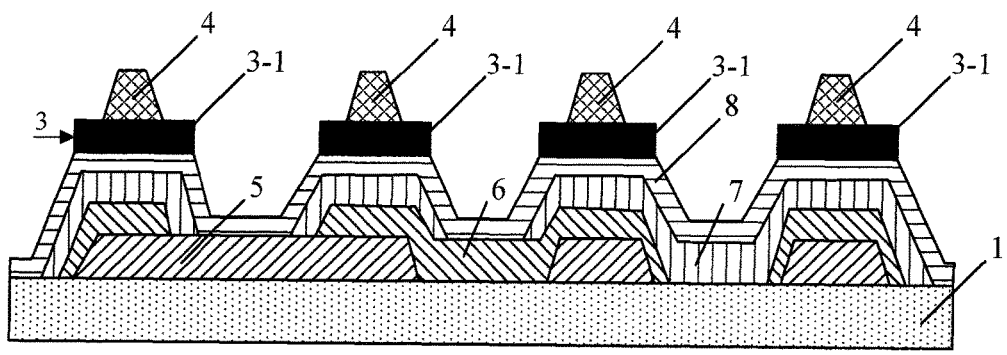
FIG. 3 is a schematically structural diagram of a CF substrate according to another embodiment of the present disclosure.

FIG. 3 is a schematically structural diagram of a CF substrate according to another embodiment of the present disclosure. In the present embodiment, the color filter substrate further comprises a barrier layer 8 formed on the color filter matrix 2, besides these shown in FIG. 2.

In a color filter substrate, since materials of a black matrix and of a color filter matrix are generally resin materials, and thus have similar material characteristics and stronger adhesion force therebetween. Therefore, during directly forming a pattern of the black matrix on the color filter matrix, there is an obvious residue phenomenon of the black matrix at the pixel regions; that is, some of the material of the black matrix will still be left within regions where the material of the black matrix is required to be removed completely during the patterning process of the black matrix, which will result in reduction in transmittance and color purity of the whole color filter substrate. In order to solve the above problem, in present embodiment, the barrier layer 8 is formed between the color filter matrix and the black matrix, wherein the barrier layer 8 may be made of an inorganic material, so that there is a smaller adhesion force between the barrier layer and the black matrix, which can reduce residues of the material of the black matrix, while ensuring that the black matrix can be successfully formed at regions where the color filters are overlapped. Exemplarily, the inorganic material may be silicon dioxide ($SiO_2$), and preferably, is a silicon dioxide film.

Optionally, the barrier layer 8 is formed by using semiconductor processes, such as plasma enhanced chemical vapor deposition (PECVD) method and the like.

In one example, an $SiO_2$ film with a thickness of 100 Å~200 Å may be deposited at 350° C. by using PECVD with a deposition atmosphere of $N_2O+N_2+SiH_4$, and deposition conditions including power of 800 W and pressure of 1500 mTorr.

It will be understood by those skilled in the art that the black matrix is used to space the red, green and blue photoresists of the color filter away from one another, and mainly functions to prevent leakages of background light, to improve display contrast, to avoid color mixture and to increase color purity; that is, non-pixel regions where the black matrix is formed can be used to block the background light, while the pixel regions where the black matrix is not formed enable the background light to pass therethrough and then red, green and blue light will be out after the passed background light passing through the red, green and blue photoresists. It is noted that the background light described herein means light emitted from a side of the back panel facing the color filter substrate, which is backlight for LCD and is light emitted actively from the EL device for OLED. Thus, the black matrix is generally made of a material of high opacity, and the material of the black matrix and the material of the color filter matrix are generally resin materials, and thus have similar material characteristics and a stronger adhesion force therebetween. Therefore, during a process of directly forming a pattern of the black matrix on the color filter matrix, due to technical limitations for manufacturing processes such as development, rinsing or the like, there is an obvious residue phenomenon of the black matrix at the corresponding pixel regions; that is, some of the material of the black matrix will still be left within regions where the material of the black matrix is required to be removed completely during the patterning process of the black matrix, which will result in that light from corresponding pixel regions will be shielded to a certain extent by the residual material of the black matrix, thereby resulting in quality defects such as reduction in color purity, reduced display contrast of the display panel and the like, and in serious case, resulting in that the color filter cannot be used directly.

The barrier layer, which is used for reducing residues of the material of the black matrix, is formed on the color filter matrix 2, and then, the material for the black matrix is coated on the barrier layer, as a result, after exposure, development and patterning, the residues of the material of the black matrix are greatly reduced so as to improve the production yield of the color filter substrate. Further, $SiO_2$, due to its good hydrophobicity and transmittance, can further reduce the residues of the material of the black matrix when it is used for manufacturing the barrier layer.

Preferably, the barrier layer is subjected to ashing treatment.

The ashing treatment is of a surface treatment method, in which plasma of reaction gases (mainly, oxygen plasma) is used for ashing (incineration), so as to change some of surface characteristics of the material or to directly remove some of the material.

In order to further reduce BM residue phenomenon, the ashing treatment is performed on the substrate formed with the barrier layer before spin coating the material for the black matrix, and after the ashing treatment, surface characteristics of the barrier layer can be changed so as to change a surface contact angle between the barrier layer and the material of the black matrix, so that the BM can be easily peeled off and rinsed from the surface of the barrier layer, thereby further reducing BM residue phenomenon. In one example, the ashing treatment may be performed in an $O_2$ atmosphere for a treatment time of 10 s~30 s.

Figure 4:
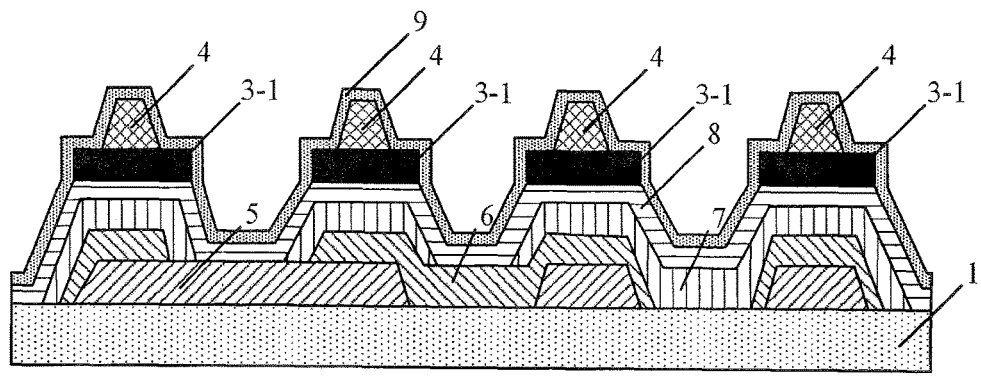
FIG. 4 is a schematically structural diagram of a CF substrate according to a further embodiment of the present disclosure.

FIG. 4 is a schematically structural diagram of a CF substrate according to further embodiment of the present disclosure. In the present embodiment, besides structures shown in FIG. 3, an auxiliary electrode layer 9 is further formed on color filter substrate and is used as an auxiliary electrode to be electrically connected with a cathode, thereby reducing resistance of the cathode and reducing voltage drop.

The auxiliary electrode layer 9 is made of transparent conductive material, which may include materials such as transparent metal film, transparent metal oxide film, non-metal oxide film, conductive particles diffused ferroelectric material or the like, and the form of the film includes un-doped type, doped type or multi-element type single-layer film, two-layer film, multi-layer film or laminated film. Preferably, the transparent conductive material is a metal oxide film, such as tin indium oxide (ITO) film.

It is noted that FIG. 4 only exemplarily illustrates the present embodiment, and of course, the auxiliary electrode layer 9 may be also formed on the color filter substrate shown in FIG. 2. That is, combinations of respective separate material layers are not limited in the present disclosure, and any possible combination enabling functions of the color filter substrate of the present disclosure will fall into the scope of the present disclosure.

Preferably, a direct projection area of the spacer 4 on the base substrate 1 is smaller than that of its corresponding black matrix unit 3-1 on base substrate 1.

With the arrangement of the present disclosure, there are a smaller gradient of a raised portion of the auxiliary electrode layer and a higher adhesion force between the auxiliary electrode layer and other film layers, so that the auxiliary electrode layer will not easily fall off during assembling, compared to the arrangement of the auxiliary electrode layer formed on a single spacer in prior art.

According to embodiments of the present disclosure, on one hand, the red, green and blue photoresists are respectively and separately arranged within corresponding pixel regions, and are overlapped with one another at the gap regions between corresponding adjacent pixels, to form three-layer stacked structures. Thus, the color filter with the stacked structure has a greater height than existing color filter, which reduces the manufacturing height of the spacers, thereby reducing process implementation difficulty and improving production yield of the color filter. On the other hand, provision of the barrier layer enables a great reduction in residues of a material of the black matrix and further improvement of the production yield of the color filter substrate. Further, the black matrix is arranged on the color filter matrix and is located closer to light-emitting regions of pixels, which reduces, when compared to prior art, light leakage phenomenon among pixel regions in a better way, and may further increase an understructure height of the color filter substrate, thereby further decreasing the manufacturing height of the spacers and reducing process implementation difficulty, and improving the production yield of the color filter. In a still further aspect, in the present disclosure, the stacked arrangement of overlapping the color filter matrix, the black matrix and the spacer enables the manufactured color filter substrate to be more stable and firmer than a single-spacer design in prior art during assembling, thereby still further improving reliability and production yield of the color filter substrate.

According to another exemplary embodiment of the present disclosure, there is also provided an organic light emitting display panel comprising the color filter substrate as described above. This organic light emitting display panel may be, for example, AMOLED.

According to a further exemplary embodiment of the present disclosure, there is also provided a display device comprising the organic light emitting display panel as described above.

Figure 5A:
FIG. 5 is a process flow diagram of manufacturing a CF substrate according to one embodiment of the present disclosure.
Figure 5B:
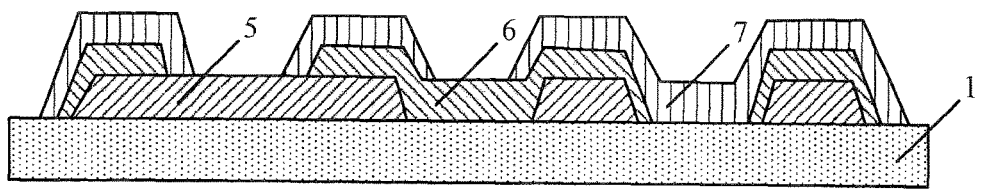
Figure 5C:
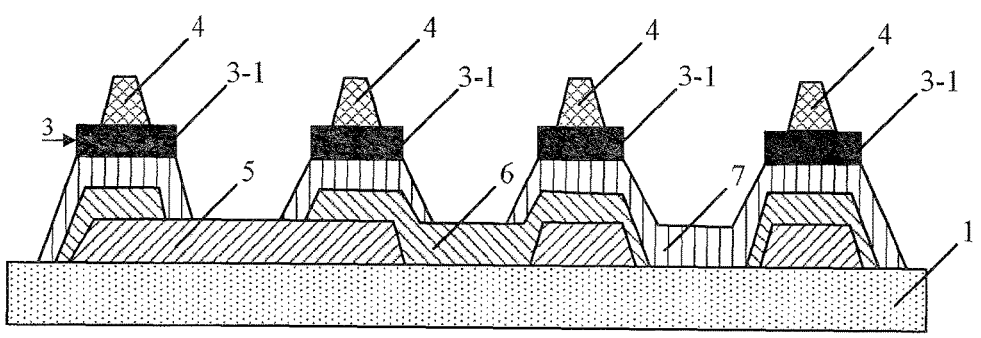

According to a still further exemplary embodiment of the present disclosure, there is also provided a method of manufacturing a color filter substrate, as shown in FIGS. 5a-5c, and the method comprises steps of:

forming, on a base substrate 1, and patterning, red, green and blue photoresist layers so as to form a color filter matrix 2 comprising a plurality of groups of red photoresists 5, green photoresists 6 and blue photoresists 7 corresponding to a pixel array. In the color filter matrix 2, the red, green and blue photoresists 5, 6, 7 are respectively and separately formed within corresponding pixel regions P, and are overlapped with one another to form three-layer stacked structures within gap regions V between adjacent pixel regions P, as shown in FIG. 5a and FIG. 5b. Exemplarily, material for manufacturing the base substrate 1 may include glass, silicon, quartz, plastic or the like, and preferably, is glass.

In one example, the red, green and blue photoresist layers are formed by using semiconductor processes such as spin-coating and the like, and are patterned by using semiconductor processes such as exposure, development and the like, so as to form the plurality of groups of red photoresists 5, green photoresists 6 and blue photoresists 7 corresponding to the pixel array.

FIG. 5b shows a color filter matrix 2 with the stacked structure according to one embodiment of the present disclosure. In FIG. 5b, the red, green and blue photoresists 5, 6, 7 are coated and patterned, so that the red, green and blue photoresists 5, 6, 7 are respectively and separately formed within corresponding pixel regions, and are overlapped with one another to form three-layer stacked structures within gap regions between adjacent pixel regions. Of course, the red, green and blue photoresists may be formed in other manners by those skilled in the art, and the forming manners and processes are not limited in the present disclosure, as long as each of the pixel regions is formed with only a photoresist of corresponding one of the colors therewithin, while three-layer stacked structures of the red, green and blue photoresists are formed within respective gap regions between adjacent pixel regions.

According to embodiments of the present disclosure, the red, green and blue photoresists, which are respectively and separately formed within corresponding pixel regions, are formed and overlapped with one another within gap regions between adjacent pixel regions, further with reference to FIG. 5b. Four raised regions shown in FIG. 5b correspond to gap regions between adjacent pixel regions, and red, green and blue photoresists are formed to be overlapped with one another within the four gap regions, the color filter having such formed stacked structure is increased in height compared to the color filter in prior art, which can reduce the manufacturing height of the spacers 4, thereby reducing process implementation difficulty and improving production yield of the color filter.

According to the manufacturing method of the present embodiment, patterns of a black matrix and spacers are further sequentially formed on the stacked structures of red, green and blue photoresists in the color filter matrix 2, that is, the black matrix 3 and the spacer 4 are formed on each of the stacked structures of the red, green and blue photoresists, as shown in FIG. 5c.

The black matrix 3 is made of a material of high opacity.

The spacer 4 is used as a support, and is made of a material having high elastic recovery rate and high deformation bearing capacity under an external pressure, thereby the manufactured substrate can be more stable and firmer during assembling, and the finished AMOLED has higher pressure resistance and deformation resistance.

The above arrangement of the black matrix 3 can reduce light leakage among pixel regions, further increase the understructure height of the color filter substrate, further reduce the manufacturing height of the spacer 4, reduce process implementation difficulty, and improve the production yield of the color filters. The stacked arrangement of the color filter matrix, the black matrix and the spacers, provided in embodiments of the present disclosure, enables the manufactured color filter substrate to be more stable and firmer than a single-spacer design in prior art during assembling, thereby further improving reliability and production yield of the color filter substrate.

FIG. 6 is a process flow diagram of manufacturing a CF substrate according to another embodiment of the present disclosure. In the present embodiment as shown in FIG. 6, after forming the color filter matrix 2 on the base substrate 1 shown in FIG. 6a and FIG. 6b, the method further comprises a step of forming a barrier layer 8 on the color filter matrix 2, as shown in FIG. 6c, wherein the barrier layer 8 is made of inorganic material, in order to reduce residues of the material of the black matrix, while ensuring that the black matrix can be successfully formed at regions where the color filters are overlapped. Preferably, the inorganic material may be silicon dioxide ($SiO_2$), and preferably, is a silicon dioxide thin film.

Exemplarily, the barrier layer 8 is formed by using semiconductor processes, such as plasma enhanced chemical vapor deposition (PECVD) method and the like.

In one example, an $SiO_2$ film of 100 Å~200 Å in thickness may be deposited at 350° C. by using PECVD with a deposition atmosphere of $N_2O+N_2+SiH_4$, and deposition conditions including power of 800 W and pressure of 1500 mTorr.

As described previously, the barrier layer, which is used for reducing residues of the material of the black matrix, is formed on the color filter matrix 2, and then the material for the black matrix is spin coated on the barrier layer, thereby, after exposure, development and patterning, the residue of the material of the black matrix is greatly reduced so as to improve the production yield of the color filter substrate. $SiO_2$, due to its good hydrophobicity and transmittance, can further reduce the residues of the material of the black matrix when it is used for manufacturing the barrier layer.

Figure 6A:
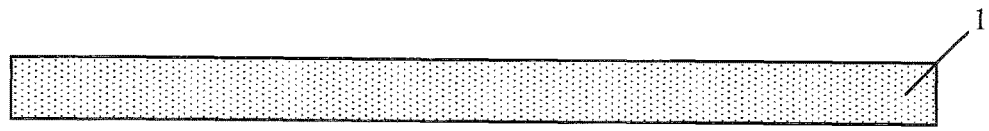
FIG. 6 is a process flow diagram of manufacturing a CF substrate according to another embodiment of the present disclosure.
Figure 6B:
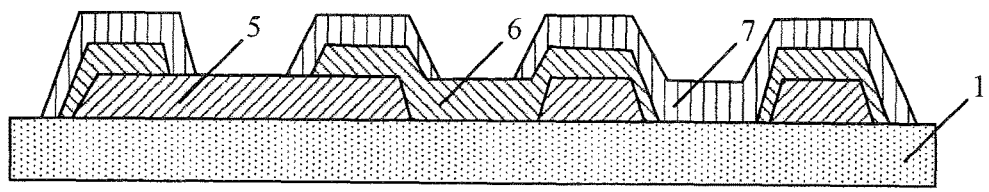
Figure 6C:
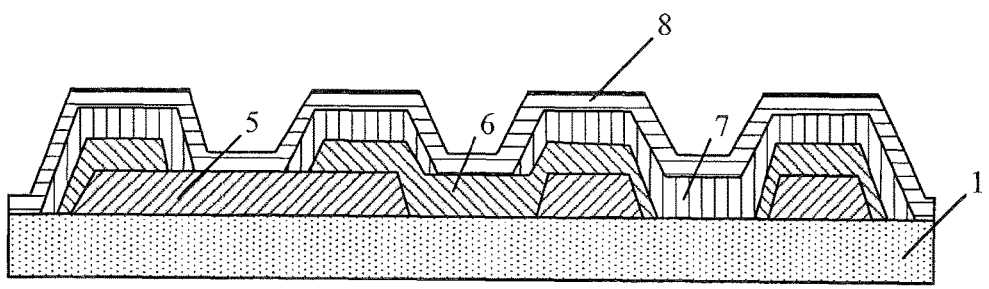
Figure 6D:
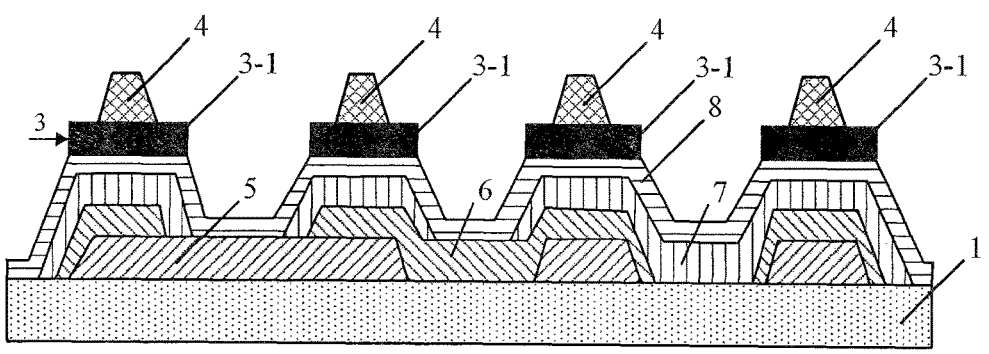

Of course, in present embodiment, the method further comprises sequentially forming a black matrix 3 and spacers 4 on the barrier layer 8, as shown in FIG. 6d.

It is noted that other steps in FIG. 6 are the same as or are similar to corresponding steps in the embodiment shown in FIG. 5, and will not be described in detail one by one.

FIG. 7 is a process flow diagram of manufacturing a CF substrate according to a further embodiment of the present disclosure. In the present embodiment as shown in FIG. 7, after forming the color filter matrix 2 on the base substrate 1 shown in FIG. 7a and FIG. 7b, and forming the barrier layer 8 on the color filter matrix 2 shown in FIG. 7c, the method further comprises a step of performing ashing treatment on the barrier layer 8, as shown in FIG. 7d.

The ashing treatment is of a surface treatment method, in which plasma of reaction gases (mainly, oxygen plasma) is used for ashing (incineration), so as to change some of surface characteristics of the material or to directly remove some of the material.

In order to further reduce BM residue phenomenon, the ashing treatment is performed on the substrate formed with the barrier layer before spin coating the material for the black matrix, and after the ashing treatment, surface characteristics of the barrier layer can be changed so as to change a surface contact angle between the barrier layer and the material of the black matrix, so that the BM can be easily peeled off and rinsed from the surface of the barrier layer, thereby further reducing BM residue phenomenon. In one example, the ashing treatment may be performed in an $O_2$ atmosphere for a treatment time of 10 s~30 s.

Figure 7A:
FIG. 7 is a process flow diagram of manufacturing a CF substrate according to a further embodiment of the present disclosure.
Figure 7B:
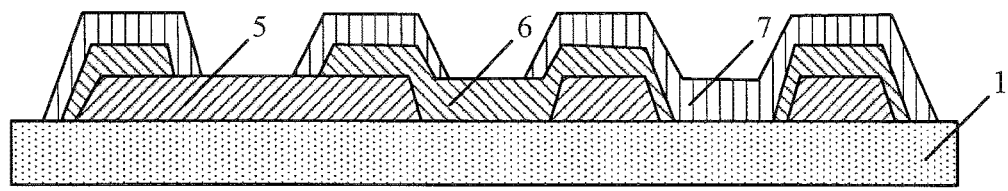
Figure 7C:
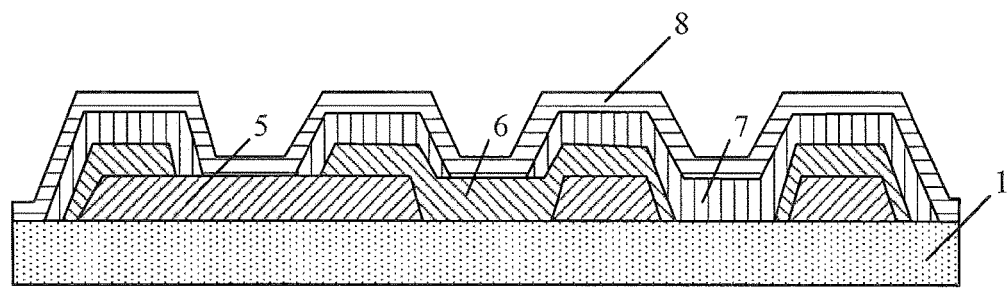
Figure 7D:
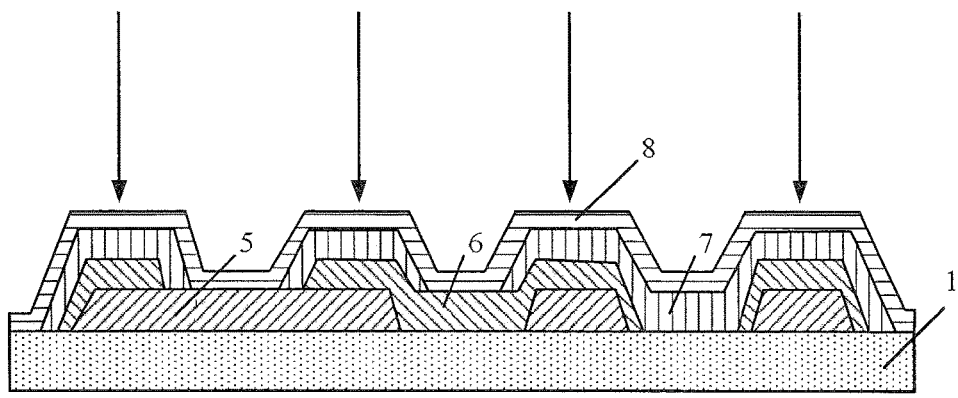
Figure 7E:
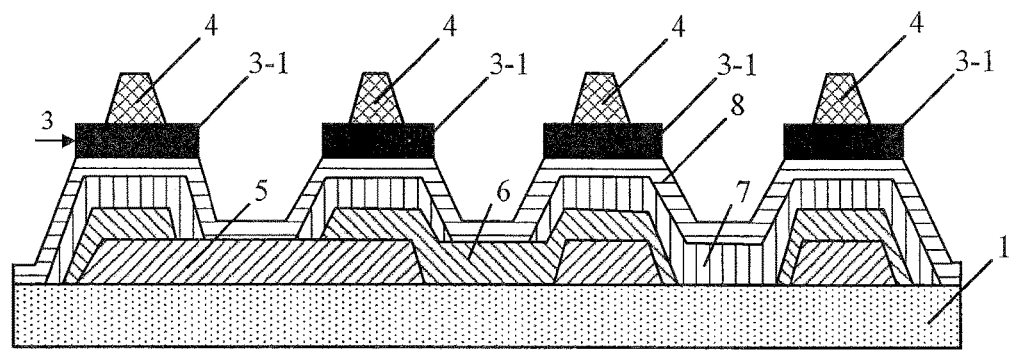
Figure 8A:
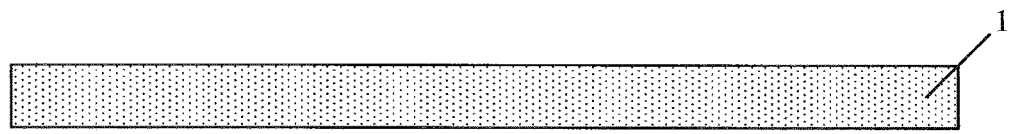
FIG. 8 is a process flow diagram of manufacturing a CF substrate according to a still further embodiment of the present disclosure.
Figure 8B:
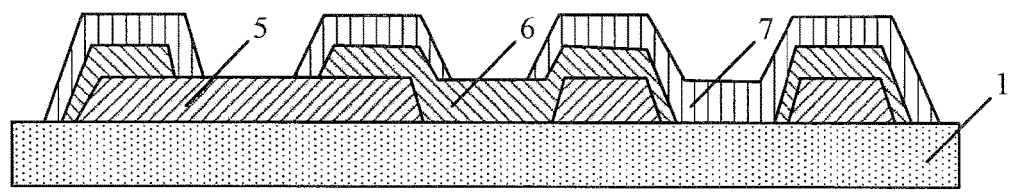
Figure 8C:
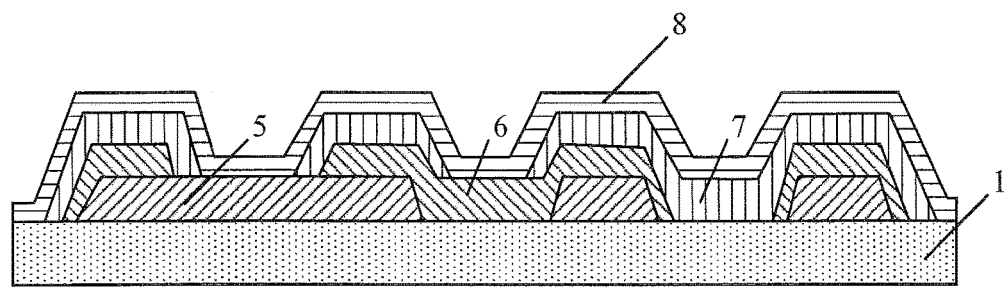
Figure 8D:
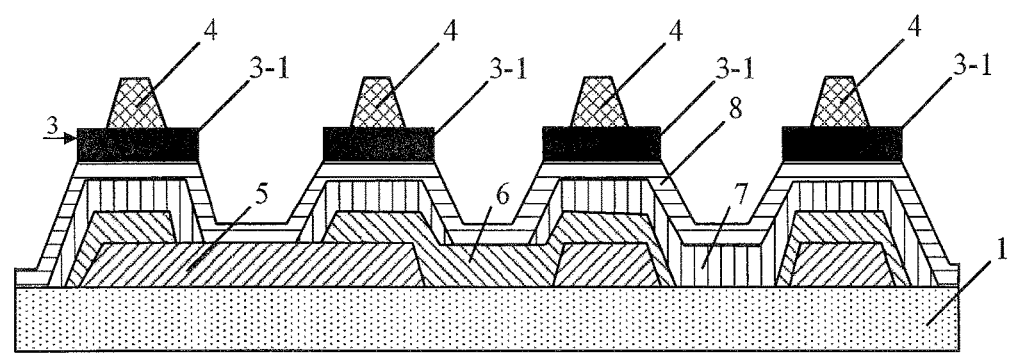
Figure 8E:
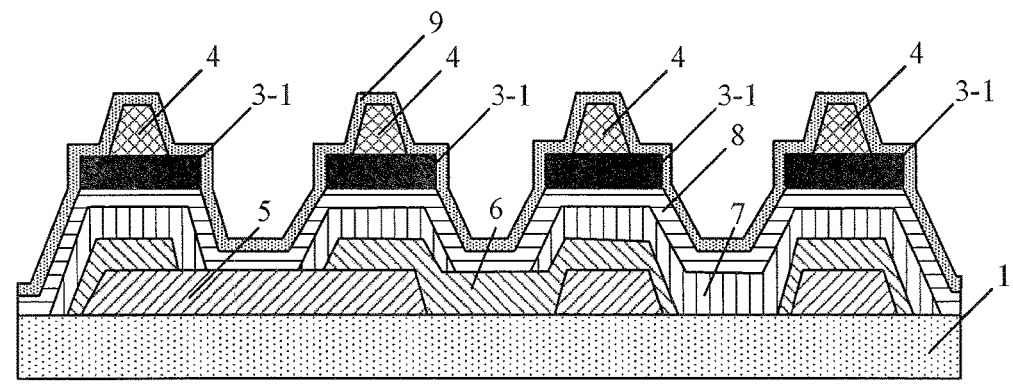

Of course, in present embodiment, the method further comprises sequentially forming a black matrix 3 and spacers 4 on the barrier layer 8 processed with the ashing treatment, as shown in FIG. 7e.

It is noted that other steps in FIG. 7 are the same as or are similar to corresponding steps in the embodiment shown in FIGS. 5 and 6, and will not be described in detail one by one.

FIG. 8 is a process flow diagram of manufacturing a CF substrate according to a still further embodiment of the present disclosure. In the present embodiment as shown in FIG. 8, after forming the color filter matrix 2 on the base substrate 1 shown in FIG. 8a and FIG. 8b, forming the barrier layer 8 on the color filter matrix 2 shown in FIG. 8c, and sequentially forming the black matrix 3 and the spacers 4 on the barrier layer 8, as shown in FIG. 8d, the method further comprises a step of forming an auxiliary electrode layer 9 on the formed color filter substrate, as shown in FIG. 8e; wherein the auxiliary electrode layer 9 is used as an auxiliary electrode to be electrically connected with a cathode, thereby reducing resistance of the cathode and reducing voltage drop.

The auxiliary electrode layer 9 is made of transparent conductive material, which may include materials such as transparent metal film, transparent metal oxide film, non-metal oxide film, conductive particles diffused ferroelectric material or the like, and the form of the film includes un-doped type, doped type or multi-element type single-layer film, two-layer film, multi-layer film or laminated film. Preferably, the transparent conductive material is a metal oxide film, such as tin indium oxide (ITO) film.

Preferably, a direct projection area of the spacer 4 on the base substrate 1 is smaller than that of its corresponding black matrix unit 3-1 on base substrate 1.

In the present embodiment, there are a smaller gradient of a raised portion of the auxiliary electrode layer and a higher adhesion force between the auxiliary electrode layer and other film layers, so that the auxiliary electrode layer will not easily fall off during assembling, compared to the arrangement of the auxiliary electrode layer formed on a single spacer in prior art.

It is noted that other steps in FIG. 8 are the same as or are similar to corresponding steps in the embodiment shown in FIGS. 5, 6 and 7, and will not be described in detail one by one.

In a yet further embodiment of the present disclosure, the method may further comprise, before spin coating red, green and blue photoresists on the base substrate 1, a step of rinsing the base substrate 1.

Rinsing operation to the base substrate may be performed by using standard rinsing methods, which is not limited in the present disclosure.

It is noted that the above process flow diagrams are only used to illustrate respectively these exemplary embodiments, and the above described steps may be combined in any way without violating common sense. Combinations and sequences of respective separate steps are not limited in the present disclosure, and any possible combinations of steps enabling functions of the color filter substrate of the present disclosure will fall within the scope of the present disclosure.

According to embodiments of the present disclosure, on one hand, the red, green and blue photoresists are respectively and separately arranged within corresponding pixel regions, and are overlapped with one another at the gap regions between corresponding adjacent pixels, to form three-layer stacked structures. Thus, the color filter with the stacked structure has a greater height than existing color filter, which reduces the manufacturing height of the spacers, thereby reducing process implementation difficulty and improving production yield of the color filter. On the other hand, provision of the barrier layer enables a great reduction in residues of a material of the black matrix and further improvement of the production yield of the color filter substrate. Further, the black matrix is arranged on the color filter matrix and is located closer to light-emitting regions of pixels, which reduces, when compared to prior arts, light leakage phenomenon among pixel regions in a better way, and may further increase an understructure height of the color filter substrate, thereby further decreasing the manufacturing height of the spacers and reducing process implementation difficulty, and improving the production yield of the color filter. In a still further aspect, in the present disclosure, the stacked arrangement of overlapping the color filter matrix, the black matrix and the spacer enables the manufactured color filter substrate to be more stable and firmer than a single-spacer design in prior art during assembling, thereby still further improving reliability and production yield of the color filter substrate.

Purposes, technical solutions and advantageous effects of the present disclosure have been further illustrated in the above specific embodiments. It should be understood that the above description is merely used to illustrate specific embodiments of the present disclosure, but not to limit the present disclosure. All of changes, equivalent alternatives, improvements, made within principles and spirit of the disclosure, should be included within the scope of the present disclosure.

What is claimed is:

1. A color filter substrate, comprising a base substrate, and, a color filter matrix, a black matrix, and spacers and a transparent auxiliary electrode layer formed in order on the base substrate, the transparent auxiliary electrode layer covering over the color filter matrix, the black matrix and the spacers and being in contact with the black matrix and the spacers, the color filter matrix being consisted of a plurality of red, green and blue photoresists, wherein:
the red, green and blue photoresists are respectively and separately formed within corresponding pixel regions, and are overlapped with one another to form three-layer stacked structures within gap regions between adjacent pixel regions, each three-layer stacked structure comprising the red, green and blue photoresists located in three different layers respectively, an uppermost photoresist of each three-layer stacked structure having an inclined side face, a portion of a lowermost photoresist of each three-layer stacked structure located within the corresponding pixel region being located in a same layer as and having a same height as another portion of the lowermost photoresist located within the corresponding gap region;
the black matrix and the spacers are sequentially formed on the stacked structures within respective gap regions and the spacers are located directly on the black matrix; and
the spacers and the black matrix form steps therebetween, and the transparent auxiliary electrode layer is located over and covers the three-layer stacked structures and the steps between the spacers and the black matrix.

2. The color filter substrate according to claim 1, further comprising a barrier layer formed between the color filter matrix and the black matrix, for reducing residues of a material of the black matrix.

3. The color filter substrate according to claim 2, wherein the barrier layer is made of inorganic material.

4. The color filter substrate according to claim 3, wherein the barrier layer is made of silicon dioxide.

5. The color filter substrate according to claim 3, wherein the barrier layer is subjected to ashing treatment.

6. The color filter substrate according to claim 2, wherein the barrier layer is subjected to ashing treatment.

7. The color filter substrate according to claim 2, wherein
the black matrix is consisted of a plurality of light shielding units,
each of the spacers is formed on corresponding one of the light shielding units, and
a direct projection area of each spacer on the base substrate is smaller than that of its corresponding light shielding unit on base substrate.

8. The color filter substrate according to claim 1, wherein
the black matrix is consisted of a plurality of light shielding units,
each of the spacers is formed on corresponding one of the light shielding units, and
a direct projection area of each spacer on the base substrate is smaller than that of its corresponding light shielding unit on base substrate.

9. An organic light emitting display panel, comprising the color filter substrate according to claim 1.

10. A method of manufacturing a color filter substrate, comprising steps of:
forming, on a base substrate, and patterning, red, green and blue photoresist layers so as to form a color filter matrix configured that the red, green and blue photoresists are respectively and separately formed within corresponding pixel regions, and are overlapped with one another to form three-layer stacked structures within gap regions between adjacent pixel regions, such that each three-layer stacked structure comprises red, green and blue photoresists located in three different layers respectively, that an uppermost photoresist of each three-layer stacked structure has an inclined side face, and that a portion of a lowermost photoresist of each three-layer stacked structure located within the corresponding pixel region is located in a same layer as and has a same height as another portion of the lowermost photoresist located within the corresponding gap region;
sequentially forming patterns of a black matrix and spacers on the stacked structures within the gap regions, the spacers being located directly on the black matrix such that the spacers and the black matrix form steps therebetween; and
forming, after forming the spacers, a transparent auxiliary electrode layer on the color filter substrate to cover over the color filter matrix, the black matrix and the spacers and to be in contact with the black matrix and the spacers, the transparent auxiliary electrode layer being located over and covers the three-layer stacked structures and the steps between the spacers and the black matrix.

11. The method according to claim 10, further comprising a step of forming a barrier layer on the color filter matrix before forming the black matrix.

12. The method according to claim 11, wherein the barrier layer is made of inorganic material.

13. The method according to claim 12, wherein the barrier layer is made of silicon dioxide.

14. The method according to claim 11, wherein the method further comprises a step of performing ashing treatment on the barrier layer, after forming the barrier layer.

15. The method according to claim 14, wherein the ashing treatment is performed in an oxygen or fluorine atmosphere for a treatment time of 10 s~30 s.

\* \* \* \* \*